US007039732B1

(12) United States Patent
House

(10) Patent No.: US 7,039,732 B1
(45) Date of Patent: May 2, 2006

(54) METHOD AND APPARATUS FOR PROVIDING REDUNDANCY BETWEEN CARD ELEMENTS IN A CHASSIS

(75) Inventor: Richard L. House, Round Rock, TX (US)

(73) Assignee: Cisco Technology, Inc., San Jose, CA (US)

( * ) Notice: Subject to any disclaimer, the term of this patent is extended or adjusted under 35 U.S.C. 154(b) by 559 days.

(21) Appl. No.: 09/904,085

(22) Filed: Jul. 12, 2001

(51) Int. Cl.
*G06F 13/00* (2006.01)

(52) U.S. Cl. ............................... 710/100; 714/2

(58) Field of Classification Search .............. 710/100; 370/359, 360, 357, 216, 217, 221–223, 225, 370/228; 714/1, 2, 25; 340/2.2, 2.23, 3.42, 340/3.44
See application file for complete search history.

(56) References Cited

U.S. PATENT DOCUMENTS

| 4,912,309 | A |   | 3/1990 | Danielson et al. .......... 235/380 |
| 5,596,569 | A | * | 1/1997 | Madonna et al. ........... 370/217 |
| 5,901,024 | A | * | 5/1999 | Deschaine et al. ............ 361/67 |
| 6,122,273 | A | * | 9/2000 | Cantwell et al. ............. 370/359 |
| 6,253,266 | B1 |  | 6/2001 | Ohanian ..................... 710/102 |
| 6,434,221 | B1 |  | 8/2002 | Chong ..................... 379/27.01 |
| 6,577,863 | B1 |  | 6/2003 | Bourlas et al. .............. 455/424 |
| 6,614,752 | B1 |  | 9/2003 | Parrish et al. ............... 370/217 |
| 6,675,254 | B1 |  | 1/2004 | Wachel ....................... 710/316 |
| 6,694,450 | B1 |  | 2/2004 | Kidder et al. ................. 714/15 |
| 6,700,868 | B1 |  | 3/2004 | Smith et al. ................. 370/217 |
| 2002/0179720 | A1 | * | 12/2002 | Liva et al. ................... 235/492 |
| 2003/0112940 | A1 | * | 6/2003 | Heilmann et al. .......... 379/188 |

OTHER PUBLICATIONS

U.S. Appl. No. 60/294,656.*

* cited by examiner

*Primary Examiner*—Tim Vo
*Assistant Examiner*—Clifford Knoll
(74) *Attorney, Agent, or Firm*—Baker Botts L.L.P.

(57) ABSTRACT

According to one embodiment of the invention, a method for providing redundancy for a card in a chassis includes providing first and second cards in a chassis. Each card has an output node connected to a common bus and a respective input node. The method also includes providing a facilitator card in the chassis. The facilitator card includes an input node connected to the common bus and an output node connected to the input node. The method further includes connecting the input node of the second card to the output node of the facilitator card and connecting the input node of the first card to the associated output node of the first card. This couples the input node of the first card to the input node of the second card to provide redundancy for the first card.

34 Claims, 2 Drawing Sheets

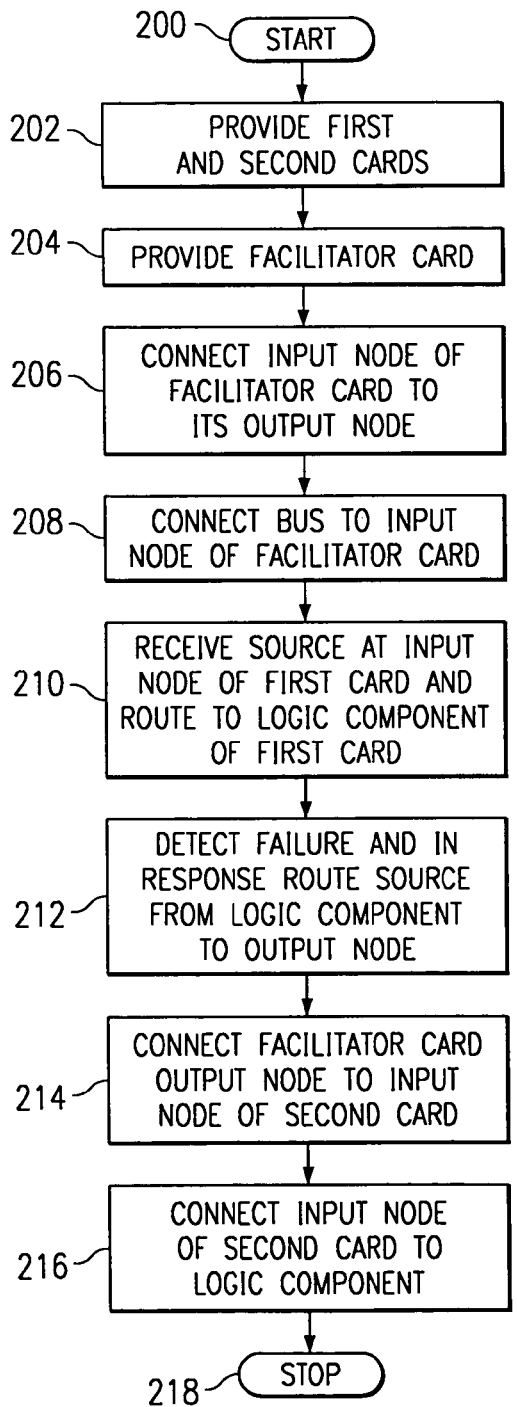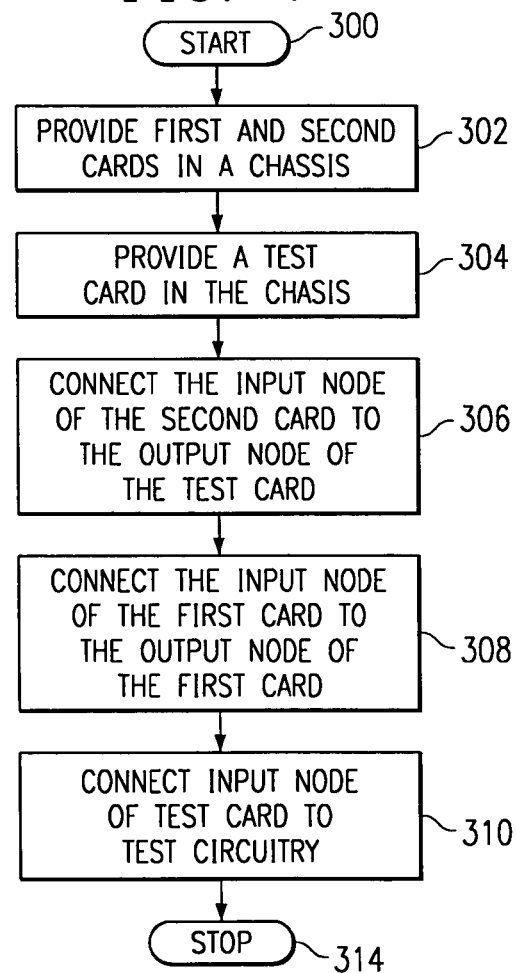

METHOD AND APPARATUS FOR PROVIDING REDUNDANCY BETWEEN CARD ELEMENTS IN A CHASSIS

TECHNICAL FIELD OF THE INVENTION

This invention relates generally to telecommunications equipment and more particularly to a method and apparatus for providing redundancy between card elements in a chassis.

BACKGROUND OF THE INVENTION

Telecommunications is becoming increasingly important in today's society. In addition to voice traffic, the advent of the Internet has greatly increased the amount of data exchanged over telecommunications lines. For example, many persons access the Internet from home computers. To facilitate such access, a telecommunications central office may utilize a telecommunications chassis that is connected to the home user through telephone lines.

A conventional telecommunications chassis may include a plurality of cards, or processing capability embedded on a physical device, disposed in slots in the chassis. Example cards include devices known as "line cards," which include functionality that terminates communication at the central office. An example line card is an ADSL line card, which includes the functionality that provides an ADSL connection between a central office and a person's home. The ADSL line card may in turn communicate with another card on the chassis, such as a network interface card. The network interface card may address communications with networks upstream from the central office, performing switching functions.

Conventionally, each chassis includes a plurality of line cards and one or more common cards, such as a network interface card. Because both types of cards occasionally fail, it is desirable to provide some redundancy for the cards. According to one approach, one redundant card is provided for each operating card. However this type of redundancy is expensive. Such redundant systems may allow one card to back up a plurality of others, known as "N:1" redundancy; however, such an approach has disadvantages. According to one approach, a protect bus on the backplane of the chassis is used to connect a line card to a redundant line card. When a failure is detected in the line card, switching routes communication from a user's home across the protect bus to the redundant line card. However, conventionally such redundancy requires a non-generic line card with switching capability to serve as the redundant card. This requires maintaining two different types of cards for each distinct product line, which is expensive and cumbersome.

SUMMARY OF THE INVENTION

Therefore, a need has arisen for a method and apparatus for providing redundancy between line card elements in a chassis. The present invention provides a method and apparatus for providing redundancy between card elements in a chassis.

According to one embodiment of the invention, a method for providing redundancy for a telecommunications card in a chassis includes providing first and second telecommunications cards in a chassis. Each card has an output node connected to a common bus and a respective input node. The method also includes providing a facilitator card in the chassis. The facilitator card includes an input node connected to the common bus and an output node connected to the input node. The method further includes connecting the input node of the second card to the output node of the facilitator card and connecting the input node of the first card to the associated output node of the first card. This couples the input node of the first card to the input node of the second card to provide redundancy for the first card.

According to another embodiment of the invention, an apparatus includes a chassis having a plurality of slots and a backplane. The apparatus also includes first and second cards disposed in respective ones of the plurality of slots. The first and second cards each have an input node, an output node, card logic, and a switch operable to selectively connect the input node to either the output node or the card logic. The apparatus also includes a facilitator card disposed in one of the plurality of slots. The facilitator card has an input node, an output node, and a first connector operable to connect the input node of the facilitator card to the output node of the facilitator card. The backplane comprises a bus connected to the output nodes of the first and second cards and the input node of the facilitator card. The system also includes a second connector connecting the output node of the facilitator card to the input node of the second card.

According to yet another embodiment of the invention, a method for facilitating testing of subscriber lines includes providing first and second cards in a chassis. Each card includes an output node connected to a common bus and a respective input node. The method also includes providing a test card in the chassis. The test card has an input node connected to the common bus, an output node, and test circuitry. The method also includes connecting the input node of the second card to the output node of the test card and connecting the input node of the first card to the associated output node of the first card. The method also includes connecting the input node of the test card to the test circuitry, thereby coupling the input node of the first card to the test circuitry.

Some embodiments of the invention provide numerous technical advantages. Other embodiments may realize some, none, or all of these advantages. For example, according to one embodiment, redundancy for telecommunications cards is provided through the use of one additional telecommunications card and the use of one facilitator card. This allows N:1 redundancy but also allows the redundant card to be used as a primary card without significant effort. Furthermore, such redundancy may be achieved without requiring a specialized redundant card. This reduces inventory requirements by a factor of two, resulting in more efficient production.

Other advantages may be readily ascertainable by those skilled in the art and the following figures, description, and claims.

BRIEF DESCRIPTION OF THE DRAWINGS

For a more complete understanding of the present invention and the advantages thereof, reference is now made to the following description taken in conjunction with the accompanying drawings, wherein like reference numbers represent like parts, and:

FIG. 3 is a flow chart showing a method for providing redundancy in a telecommunications apparatus according to the teachings of the invention; and FIG. 4 is a flow chart showing a method for testing a telecommunications card according to the teachings of the invention.

DETAILED DESCRIPTION OF THE INVENTION

Embodiments of the invention and its advantages are best understood by referring to FIGS. 1 through 4 of the drawings, like numerals being used for like and corresponding parts of the various drawings.

Figure 1:
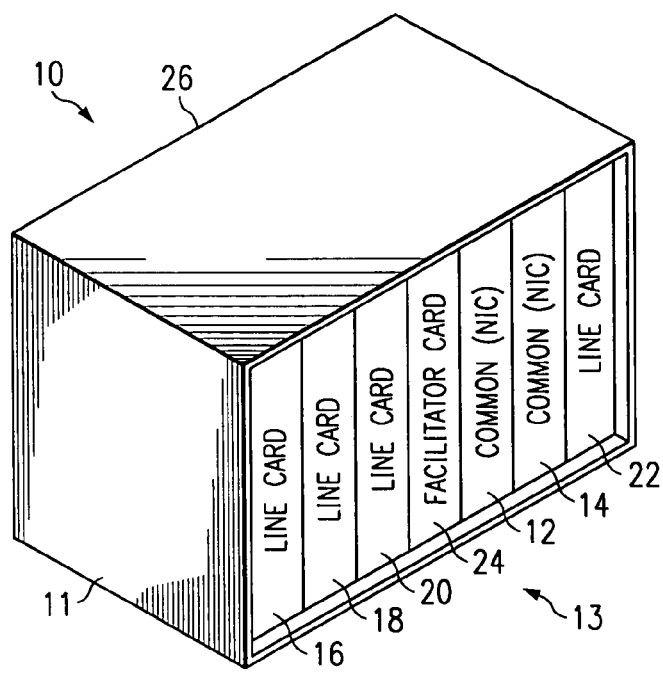
FIG. 1 is a schematic diagram of a telecommunications apparatus providing redundancy according to the teachings of the invention.

FIG. 1 is a schematic diagram of a telecommunications apparatus 10. According to the teachings of the invention, telecommunications apparatus 10 is a telecommunication device that may be utilized in a central office or other suitable location. Examples of Apparatus 10 include Digital Subscriber Line Access Multiplexers (DSLAM), such as Lucent Stringer RT, Alcatel 7300, and Nortel IMAS; however other types of telecommunications devices may benefit from the teachings of the invention. Apparatus 10 includes a chassis 11 having a plurality of slots 13. Disposed within the plurality of slots are a plurality of telecommunications cards 15. For example, a common network interface card 12 and a backup common interface card 14 are shown. In addition, a plurality of line cards 16, 18, 20, and 22 are shown in this example. Line cards include functionality that terminates communication at a central office or other suitable location. Chassis 11 is formed with a backplane 26. Backplane generally refers to the back portion of chassis 11 in which wiring between card elements is formed.

According to the teachings of the invention, a facilitator card 24 is also disposed within chassis 11. Facilitator card 24 may be used to facilitate redundancy of line cards 16, 18, 20, and 22, common network interface cards 12 and 14, or redundancy within other types of cards. As described in greater detail below, facilitator card 24 may appropriately route communications signals from a failed card to a redundant card, providing redundancy. In some embodiments, facilitator card 24 also allows testing of a card in chassis 11. Through the use of facilitator card 24, N:1 redundancy is provided without the use of a non-generic redundant card. This means that one redundant card may provide redundancy for a plurality of other cards, rather than for just one card. In addition, according to the teachings of the invention, in some embodiments the redundant card may also be used as a primary card with little reconfiguration.

Figure 2:
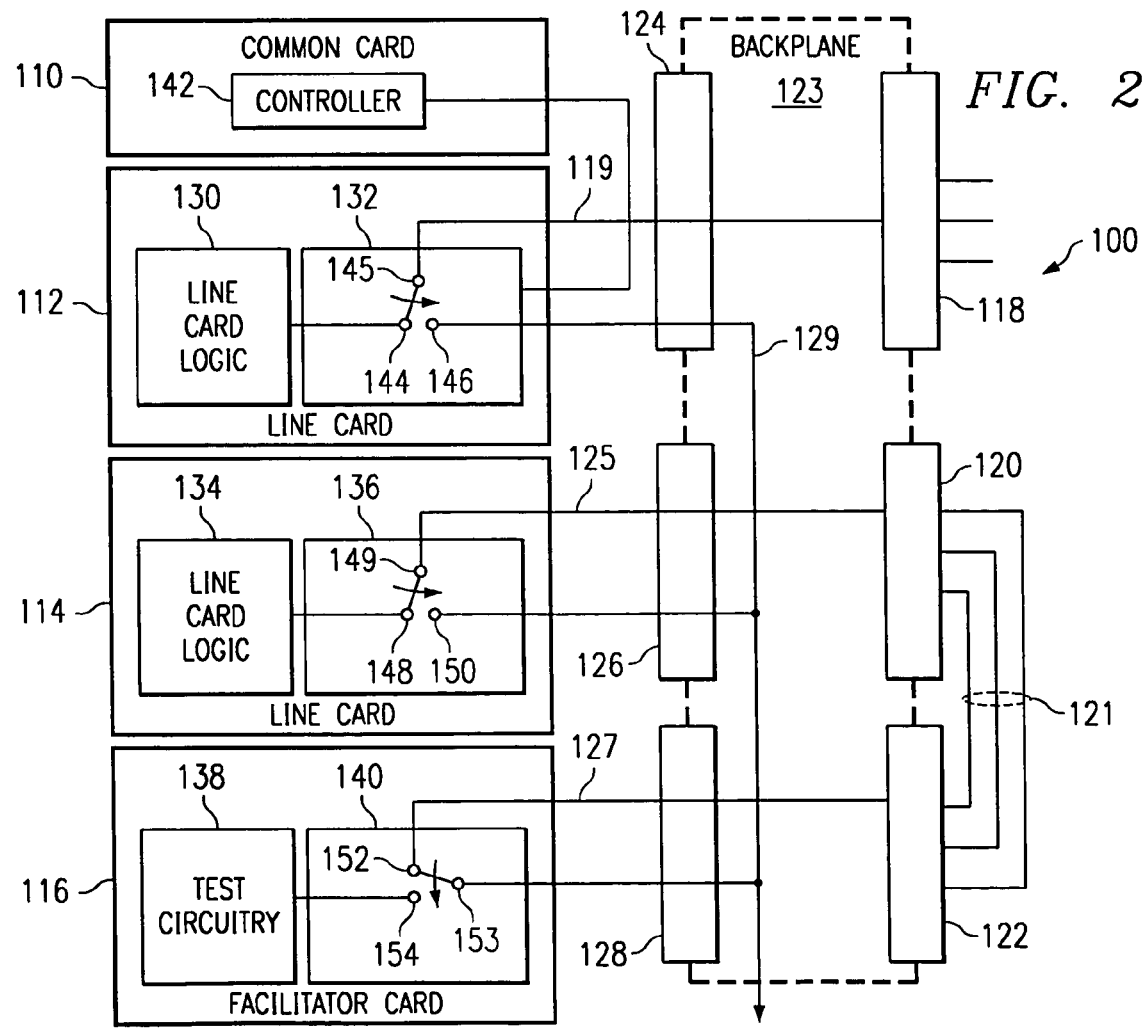
FIG. 2 is a schematic diagram of selected cards of the telecommunications apparatus of FIG. 1.

FIG. 2 is a block diagram showing a redundancy system 100. Redundancy system 100 includes a common card 110, such as common cards 12 and 14, first and second line cards 112 and 114, such as line cards 16, 18, 20, and 22, a facilitator card 116, such as facilitator card 24, and a protect bus 129 connecting cards 112, 114, and 116. According to the teachings of the invention, line card 114 acts as a redundant line card for 112, but may be manufactured identically to 112. Thus, line card 112 could also act as a back up for line card 114 and line card 114 may serve in a primary capacity. Redundancy system 100 also includes a cable 121, which facilitates line card 114 receiving data when line card 112 fails or at other desired times, which is described in greater detail below.

Line card 112 is associated with an interface connector 118. In one embodiment, interface connector 118 is a metallic interface connector; however, any suitable connector may be used. In this embodiment, interface connector 118 resides on backplane 123 of a telecommunications chassis, such as backplane 26. Line card 112 receives data and voice communications originating at a customer's premises or other suitable location.

Line card 114 is associated with an interface connector 120. In one embodiment, interface connector 120 is a metallic interface connector; however, any suitable connector may be utilized. In this embodiment, interface connector 120 resides on backplane 123. Line card 114 receives its input through interface connector 120, as described in greater detail below.

Facilitator card 116 is associated with an interface connector 122. In one embodiment, interface connector 122 is a metallic interface connector; however, other suitable interface connectors may be used. Facilitator card provides its output through interface connector 122, as described in greater detail below.

Connections of line cards 112, 114 and redundancy facilitator card 116 to interface connectors 118, 120, and 122, respectively, are made, in this embodiment, through backplane connectors 124, 126, and 128. Any suitable backplane connector may be used for this purpose; however, one example of a suitable back plane connector is Erni RDJN (Mfg PN# 943159).

Additional details of line cards 112 and 114 are described below. Line card 112 includes line card logic 130, a switch 132, an input node 145, and an output node 146. Line card logic 130 includes any suitable logic for implementing the desired function of line card 112. For example, in one embodiment, line card 112 is a Cisco ATUC, which stands for ADSL Termination Unit, Central Office. Thus, line card 112 provides functionality associated with ADSL communication. In this example, line card logic 130 includes an ADSL chip set, an analog front end, and associated digital signal processors (not explicitly shown). However, line card logic 130 may include any suitable logic for implementing the desired functions of line card 112. Line card 112 also includes a switch 132. In this embodiment, switch 132 is controlled by a controller 142 in common card 110, as described in greater detail below. Switch 132 switches input node 145 between nodes 144 and output node 146. Node 144 allows input to line card logic 130.

When line card 112 is operating properly, communications received by interface connector 118 over line or lines 119 are provided from input node 145 to logic unit 130 by positioning of switch 132 in the illustrated position. When line card 112 is not operating properly, switch 132 switches from node 144 to node 146. This allows line card 114 to replace line card 112, as described in greater detail below.

Controller 142 on common card 110 may be utilized to effect such switching; however, other controllers located in other locations may also be used. As an example, controller 142 may switch switch 132 from node 144 to output node 146 in response to detection of a power failure in line card 112.

Line card 114 is substantially similar to line card 112 and includes a line card logic unit 134, an input node 136, an output node 150, and a switch 136. Switch 136 switches input node 136 between node 148 and output node 150. The operation of these components of line card 114 are substantially similar to line card 112. However, in the illustrated embodiment, controller 142 does not control switch 136; rather, switch 136 is always in the illustrated position. However, according to the teachings of the invention, because line card 114 and line card 112 are substantially identical, line card 114 may also act as a primary operating line card rather than simply a redundant line card in some configurations.

When it is determined that line card 114 should take over for line card 112, such as in the case of a power failure, switch 132 of line card 112 connects input node 145 to output node 146 of line card 112. Communications received at interface connector 118 are therefore provided to protect bus 129 through output node 146. In such a case, redundancy facilitator card 116 operates to provide data on protect bus 129 to interface connector 122, as described in greater detail below. Facilitator card 116 includes an input node 153 and an output node 152. In the illustrated embodiment, a switch 140 connects input node 153 to output node 152, thus providing data on protect bus 129 to interface connector 122. Interface connector 122 in turn provides the data over cable 121 to interface connector 120 for receipt by input node 149 of line card 114 over line 125. According to one embodiment of the invention, cable 121 is an AMPHENOL twenty-five, pair cable that connects interface connector 120 and 122; however, any suitable connector may be used. The data is in turn provided through node 148 to line card logic 134. In this manner, facilitator card allows communication of data to line card 114, but does so in a manner that allows line card 114 to have a substantially similar configuration to line card 112. In addition, line card 114 may also be used to directly receive data from a customer's premises rather than as a redundant card. In such an embodiment, cable 121 is detached from interface connector 120 and telecommunications lines are attached to interface connector 120. In addition, the detached end of cable 121 may be connected to interface connector 118, allowing line card 112 to serve as a redundant card.

In the illustrated embodiment, facilitator card 116 also includes test circuitry 138. In some embodiments a switch 140 and test circuitry 138 are not utilized and input node 153 and output node 152 may be directly connected. Switch 140 may be utilized to route telecommunications data received from a customer premises at node 153 to test circuitry 138 for various testing purposes by connecting node 153 to node 154. Alternatively, switch 140 may connect backplane 129 to network interface 122 over line or lines 127 by connecting node 153 to node 152. In other embodiments, facilitator card 116 provides a direct connection between input node 153 and output node 152.

Thus, according to the teachings of the invention, a system is provided that provides redundancy between line cards but allows for the use of substantially identical line cards to provide such redundancy. The teachings of the invention may also be applied to common cards 110 and 12, 14 within a telecommunications chassis. By facilitating the use of substantially identical line cards as redundant cards, only one product line for each type of line card need be maintained. Furthermore, line card 114, which in the illustrated embodiment is used as the redundant card, may be easily used as a primary active card by simply connecting lines from a telecommunications premises to interface connector 120 after removing cable 121. A method for providing such redundancy is described in greater detail below in connection with FIG. 3.

FIG. 3 is a flow chart showing the method for providing redundancy between line card elements in a chassis. The method is described with reference to FIGS. 2 and 3.

The method begins at step 200. At a step 202 first and second telecommunication cards are provided. Each of the telecommunication cards has an input node and an output node connected to a common bus. In one example, the cards provided at step 202 may be line cards 112, 114; however, other types of cards may be provided.

At a step 204, a facilitator card is provided. The facilitator card includes an input node connectable to an output node of the facilitator card. In this step 204, facilitator card may perform similarly to facilitator card 116 and include test circuitry 138 and a switch at 140; however, such components are not required. The input node may be connectable to the output node through a switch, such as switch 140, or the two nodes may be hardwired together, or otherwise connectable.

At a step 206, the input node of the facilitator card is connected to the output node of the facilitator card. Alternatively, the facilitator card may be formed with its input node connected to its output node. At a step 208, the input node of the facilitator card is connected to the common bus. By connecting the input node of the facilitator card to the common bus and connecting the input node of the facilitator card to the output node the facilitator card, this allows a telecommunication signal on the bus to be provided as an output of the facilitator card. This in turn facilitates redundancy.

At a step 210, a telecommunications source is received at the input node of the first card and is routed to a logic component of the first telecommunication card. Such routing allows the first telecommunication card to operate normally and process the received telecommunications source. At a step 212, a failure is detected in the first telecommunication card. This failure may be detected in any suitable manner. For example, this failure may be detected by a controller, such as controller 142 that may be stored on a common card such as common card 110; however, other controllers and other methods for detecting failure of a telecommunications card may be utilized. In response to detection of a failure, the telecommunications source is routed within the first card from the logic component to the output node connected to the bus. This routing may be performed through a switch, such as switch 132 on line card 112; however, any suitable method for routing the received telecommunications source from the line card logic to the output node of the line card may be utilized.

At a step 214, the facilitator card output node is connected to the input node of the second telecommunications card. In one example, this connection is performed by two interface connectors and a cable, such as an amphenol twenty-five pair cable, as described above in conjunction with FIG. 2; however, any suitable method for connecting the facilitator card output node to the input node of the second telecommunications card may be utilized. For example, the two may be hardwired together on the backplane of a chassis.

At a step 216, the input node of the second telecommunications card is connected to the logic component of the second telecommunications card by a switch. This connection may be formed utilizing a switch, such as switch 136 on line card 114; however, any suitable technique for connecting the input node of the second telecommunications card to the logic component of the second telecommunications card may be utilized.

Thus, a method is provided for allowing redundancy in a telecommunications chassis. The above steps were described sequentially for clarity of description; however, no specific order for implementing these steps is required.

FIG. 4 is a flow chart showing a method for testing a card according to the teachings of the invention. The method is described with reference to FIGS. 2 and 4.

The method begins at step 300. At step 302, first and second cards are provided in a chassis. Each card has an output node connected to a common bus and respective input nodes. According to one embodiment first and second cards may be formed similarly to line cards 112 and 114; however, any suitable cards may be used.

At a step 304, a test card is provided in the chassis. The test card has an input node connected to the common bus, an output node, and test circuitry. In one example, test card may be formed similarly to facilitator card 116 of FIG. 2; however, any suitable test card that includes an input node connected to the common bus and test circuitry may be utilized.

At a step 306, the input node of the second card is connected to the output node of the test card. This connection may be formed in a variety of manners. In one example, a cable and a pair of interface connectors, such as cable 121 and interface connectors 120 and 122 are used to form this connection; however, other suitable techniques for connecting the input node of the second card to the output node of the test card may be utilized.

At a step 308, the input node of the first card is connected to its output node. The step may be formed in a variety of manners. For example, a switch, such as switch 132 in line card 112 may be utilized to route the input of the first line card to its output, thereby placing the input of the first line card on the common bus. By placing the input of the first line card on the common bus, the test card may receive the input to the first line card for testing purposes.

At a step 310, the input node of the test card is connected to the test circuitry within the test card. This connection may be formed in a variety of manners, including using a switch such as switch 140 in facilitator card 116; however, any suitable manner for connecting the input node of the test card to the test circuitry may be utilized. The method concludes at step 314.

Thus, an input signal received by a first line card may be tested as described above. Such testing may be performed in an easy manner, while offering the possibility for redundancy for the line card being tested.

Although the present invention has been described with several example embodiments, various changes and modifications may be suggested to one skilled in the art. It is intended that the present invention encompass those changes and modifications as they fall within the scope of the claims.

What is claimed is:

1. A method for providing redundancy for a card in a chassis, the method comprising:
   providing first and second cards in a chassis, each card having an output node connectable to a common bus and each having a respective input node;
   providing a facilitator card in the chassis, the facilitator card having an input node connectable to the common bus and an output node;
   connecting the input node of the second card to the output node of the redundancy facilitator card; and
   coupling the input node of the first card to the input node of the second card to provide redundancy for the first card by connecting the input node of the first card to the associated output node of the first card.

2. The method of claim 1, wherein connecting the input node of the second card to the output node of the redundancy facilitator card comprises connecting the input node of the second card to the output node of the facilitator card by a cable.

3. The method of claim 2, wherein connecting the input node of the second card to the output node of the facilitator card by a cable comprises connecting the input node of the second card to the output node of the facilitator card by a twenty-five pair cable.

4. The method of claim 1, wherein connecting the input node of the first card to the associated output node of the first card comprises connecting the input node of the first card to the output node of the first card after determining that a failure has occurred in the first card.

5. The method of claim 1, wherein providing first and second cards comprises providing a line card and the second card.

6. The method of claim 1, wherein providing first and second cards comprises providing a network interface card and the second card.

7. The method of claim 1, wherein connecting the input node of the second card to the output node of the facilitator card comprises connecting the input node of the second card to the output node of the redundancy facilitator card by a cable and a pair of interface connectors, the interface connectors disposed on a backplane of the chassis.

8. The method of claim 1, wherein providing first and second cards comprises providing first and second cards each comprising circuitry operable to perform a desired telecommunication function and each comprising a switch operable to selectivity connect the input node of the card to either the output node or the circuitry of the card.

9. The method of claim 1, wherein connecting the input node of the second card to the output node of the facilitator card further comprises connecting the input node of the second card to a first interface connector located on a backplane of the chassis and connecting the output node of the facilitator card to a second interface connector located on the backplane.

10. The method of claim 9, wherein connecting the input node of the second card to the output node of the facilitator card further comprises connecting the first interface connector to the second interface connector by a cable.

11. The method of claim 10, wherein connecting the first interface connector to the second interface connector by a cable comprises connecting the first interface connector to the second interface connector by a twenty-five pin cable.

12. The method of claim 9, wherein connecting the input node of the second card to the output node of the facilitator card further comprises connecting the first interface connector to the second interface connector by conductors formed on the backplane.

13. The method of claim 1, wherein providing first and second cards in a chassis comprises providing first and second cards in a chassis, each card having an output node connectable to a common bus and each having a respective input node formed on a backplane of the chassis.

14. A method for facilitating testing of subscriber lines, the method comprising:
   providing first and second cards in a chassis, each card having an output node connectable to a common bus and each having a respective input node;
   providing a test card in the chassis, the test card having an input node connectable to the common bus, an output node, and test circuitry;
   connecting the input node of the second card to the output node of the test card;
   connecting the input node of the first card to the output node of the first card; and
   coupling the input node of the first card to the test circuitry by connecting the input node of the test card to the test circuitry.

15. The method of claim 14, wherein connecting the input node of the second card to the output node of the test card comprises connecting the input node of the second card to the output node of the test card by a cable.

16. The method of claim 15, wherein connecting the input node of the second card to the output node of the test card by a cable comprises connecting the input node of the second card to the output node of the test card by a twenty-five pair cable.

17. The method of claim 14, wherein providing first and second cards comprises providing a line card and the second card.

18. The method of claim 14, wherein providing first and second cards comprises providing a network interface card and the second card.

19. The method of claim 14, wherein connecting the input node of the second card to the output node of the test card comprises connecting the input node of the second card to the output node of the test card by a cable and a pair of interface connectors disposed on a backplane of the chassis.

20. The method of claim 14, wherein providing the first and second cards comprises providing first and second cards each comprising circuitry operable to perform a desired telecommunication function and comprising a switch operable to selectivity connect the input node of the card to either the output node or the circuitry of the card.

21. The method of claim 14, wherein connecting the input node of the second card to the output node of the test card further comprises connecting the input node of the second card to a first interface connector located on a backplane of the chassis and connecting the output node of the test card to a second interface connector located on the backplane.

22. The method of claim 21, wherein connecting the input node of the second card to the output node of the test card further comprises connecting the first interface connector to the second interface connector by a cable.

23. The method of claim 22, wherein connecting the first interface connector to the second interface connector by a cable comprises connecting the first interface connector to the second interface connector by a twenty-five pin cable.

24. The method of claim 21, wherein connecting the input node of the second card to the output node of the test card further comprises connecting the first interface connector to the second interface connector by conductors formed on the backplane.

25. The method of claim 14, wherein providing first and second cards in a chassis, each card having an output node connectable to a common bus and each having an output node connectable to a common bus comprises providing first and second cards in a chassis, each card having an output node connectable to a common bus formed on a backplane of the chassis and each having a respective input node.

26. An apparatus comprising:
a chassis having a plurality of slots and a backplane;
first and second telecommunications cards disposed in respective ones of the plurality of slots, the first and second cards each having:
an input node;
an output node;
card logic; and
a switch operable to selectively connect the input node of the card to either the output node of the card or the card logic;
a facilitator card disposed in one of the plurality of slots, the facilitator card having an input node, an output node, and a first connector operable to connect the input node of the facilitator card to the output node of the facilitator card;
wherein the backplane comprises a bus connected to the output nodes of the first and second cards and the input node of the facilitator card; and
a second connector connecting the output node of the facilitator card to the input node of the second card.

27. The apparatus of claim 26, wherein the second connector comprises a cable.

28. The apparatus of claim 27, wherein the second connector further comprises a pair of interface connectors.

29. The apparatus of claim 26, wherein the second connector comprises a twenty-five pin connector.

30. The apparatus of claim 26, wherein the first connector comprises a switch.

31. The apparatus of claim 26, wherein the first connector comprises a conductor connecting the input node of the facilitator card to the output node of the facilitator card.

32. The apparatus of claim 30, wherein the facilitator card further comprises test circuitry and the switch is further operable to selectively connect the input node of the facilitator card to the test circuitry.

33. The apparatus of claim 26, wherein the first and second cards each comprise line cards.

34. The apparatus of claim 26, wherein the first and second cards each comprise network interface cards.

* * * * *